United States Patent
Malik

(10) Patent No.: US 6,411,228 B1
(45) Date of Patent: Jun. 25, 2002

(54) APPARATUS AND METHOD FOR COMPRESSING PSEUDO-RANDOM DATA USING DISTRIBUTION APPROXIMATIONS

(75) Inventor: Nadeem Malik, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/666,331

(22) Filed: Sep. 21, 2000

(51) Int. Cl.[7] .......................... H03M 7/34; H03M 7/40
(52) U.S. Cl. ............................. 341/67; 341/51
(58) Field of Search .................. 341/50, 51, 67; 358/500; 382/238, 243, 232; 348/471; 707/7; 714/738; 704/258

(56) References Cited

U.S. PATENT DOCUMENTS

| | | | |
|---|---|---|---|
| 5,432,870 A | * 7/1995 | Schwartz | 382/232 |
| 5,450,132 A | * 9/1995 | Harris et al. | 375/240 |
| 5,602,961 A | 2/1997 | Kolesnik et al. | |
| 5,799,109 A | * 8/1998 | Chung et al. | 382/243 |
| 5,857,036 A | 1/1999 | Barnsley et al. | |
| 5,943,644 A | 8/1999 | Yamane et al. | |
| 6,327,687 B1 | * 12/2000 | Rajski et al. | 714/738 |

* cited by examiner

*Primary Examiner*—Patrick Wamsley
(74) *Attorney, Agent, or Firm*—Duke W. Yee; Mark E. McBurney; Stephen J. Walder, Jr.

(57) ABSTRACT

An apparatus and method for compressing pseudo-random data is provided. The apparatus and method make use of stochastic distribution models to generate approximations of the input data. A data sequence obtained from the stochastic distribution models is compared to the input data sequence to generate a difference data sequence. The difference data sequence tends to be less "random" than the input data sequence and is thus, a candidate for compression using pattern repetition. The difference data sequence is compressed using standard compression techniques and stored as a compressed data file along with information identifying the stochastic distribution model used and any parameters of the stochastic distribution model, including seed value and the like. When decompressing a data file compressed in the manner described above, the compressed difference data sequence is decompressed and a data sequence is generated using the identified stochastic distribution model and model parameters. The data sequence generated is then added to the difference data sequence to generate the original input data sequence.

30 Claims, 3 Drawing Sheets

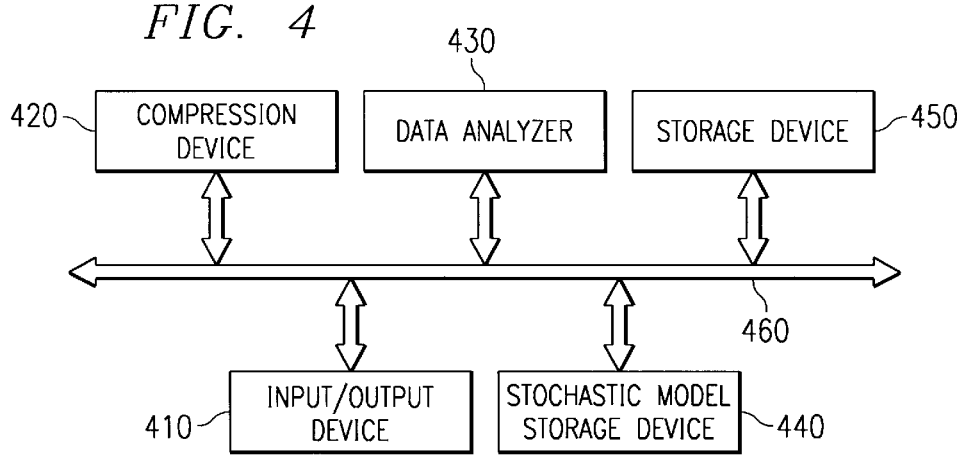
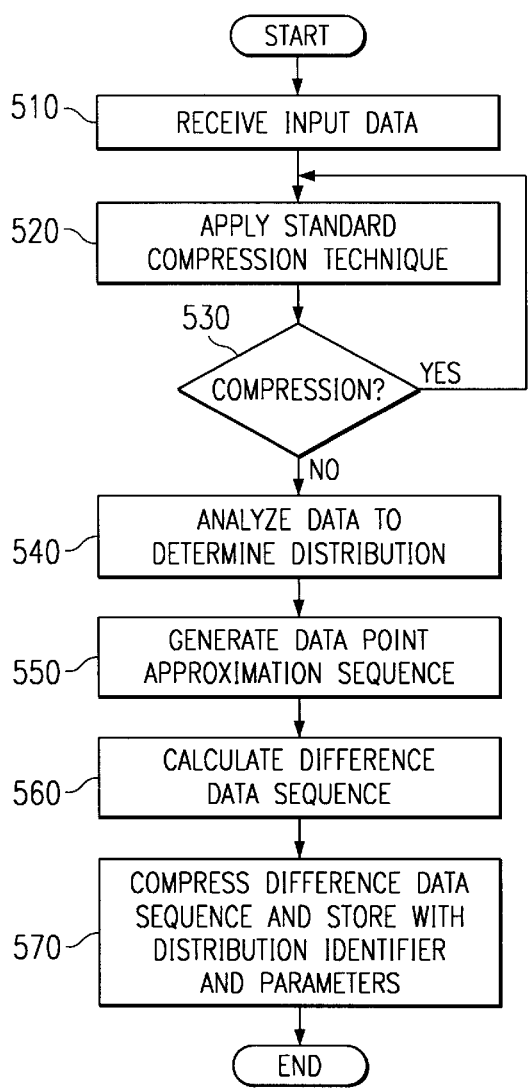
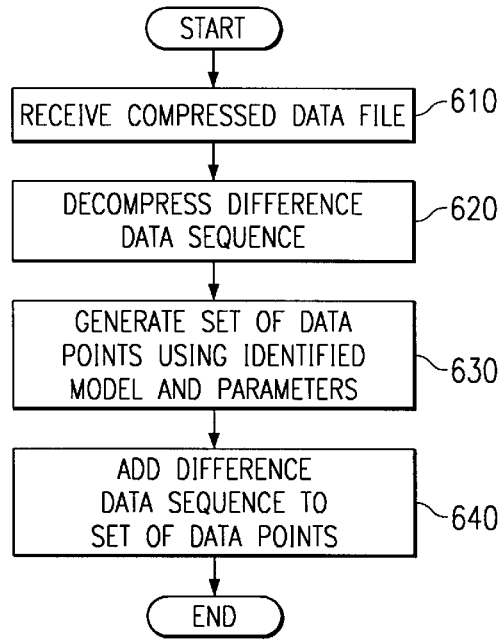

APPARATUS AND METHOD FOR COMPRESSING PSEUDO-RANDOM DATA USING DISTRIBUTION APPROXIMATIONS

BACKGROUND OF THE INVENTION

1. Technical Field

The present invention is directed to an apparatus and method for compressing pseudo-random data.

2. Description of Related Art

Data compression is generally achieved by exploiting the repetition of data. Many data sources, such as music, video, text, and the like, generally have enough repetition of data such that data compression has become a widely used practice to reduce storage and bandwidth requirements. However, many other forms of data, such as binary representations of data structures, binary executables, simulation data, and the like, do not contain much repetition. In addition, data files that have already been compressed by conventional techniques that exploit pattern repetition are not amenable to further compression. Thus, due to this pseudo-randomness of the data, very little compression of the data is obtainable.

It would therefore be beneficial to have an apparatus and method for compressing pseudo-random data that is not compressible using standard conventional compression techniques.

SUMMARY OF THE INVENTION

The present invention provides an apparatus and method for compressing pseudo-random data. The apparatus and method of the present invention make use of stochastic distribution models to generate approximations of the input data. A data sequence obtained from the stochastic distribution models is compared to the input data sequence to generate a difference data sequence. The difference data sequence tends to be less "random" than the input data sequence and is thus, a candidate for compression using pattern repetition. The difference data sequence is compressed using standard compression techniques and stored as a compressed data file along with information identifying the stochastic distribution model used and any parameters of the stochastic distribution model, including seed value and the like.

When decompressing a data file compressed in the manner described above, the compressed difference data sequence is decompressed and a data sequence is generated using the identified stochastic distribution model and model parameters. The data sequence generated is then added to the difference data sequence to generate the original input data sequence. Other features and advantages of the present invention will be described in, or will become apparent to those of ordinary skill in the art in view of, the following detailed description of the preferred embodiment.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is an exemplary block diagram of the principle elements of the compression apparatus of the present invention;

FIG. 5 is a flowchart outlining an exemplary operation of the present invention during compression; and FIG. 6 is a flowchart outlining an exemplary operation of the present invention during decompression.

DETAILED DESCRIPTION OF THE PREFERRED EMBODIMENT

Figure 1:
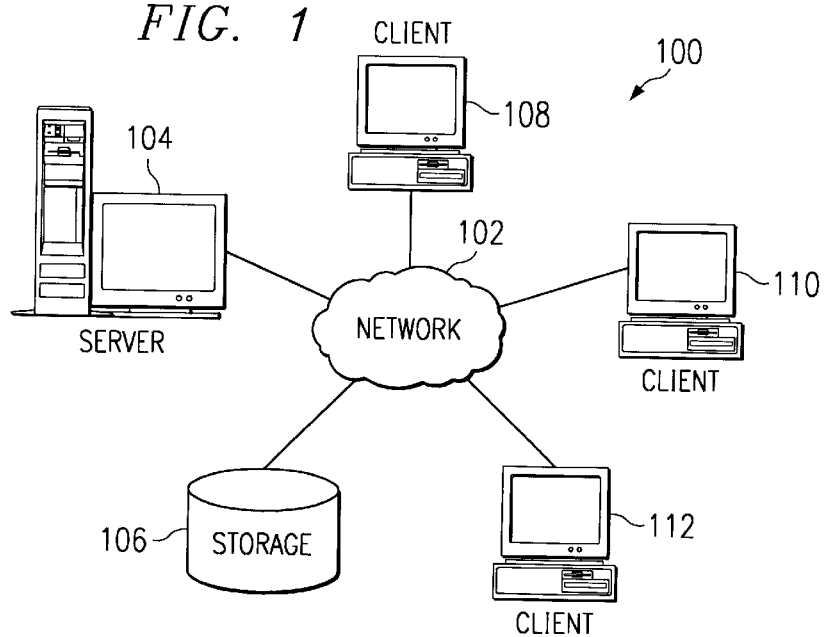
FIG. 1 is a diagram illustrating a distributed data processing system according to the present invention.

With reference now to the figures, and in particular with reference to FIG. 1, a pictorial representation of a distributed data processing system is depicted in which the present invention may be implemented. Distributed data processing system 100 is a network of computers in which the present invention may be implemented. Distributed data processing system 100 contains network 102, which is the medium used to provide communications links between various devices and computers connected within distributed data processing system 100. Network 102 may include permanent connections, such as wire or fiber optic cables, or temporary connections made through land-line or wireless connections.

In the depicted example, server 104 is connected to network 102, along with storage unit 106. In addition, clients 108, 110 and 112 are also connected to network 102. These clients, 108, 110 and 112, may be, for example, personal computers or network computers. For purposes of this application, a network computer is any computer coupled to a network which receives a program or other application from another computer coupled to the network. In the depicted example, server 104 provides data, such as boot files, operating system images and applications, to clients 108–112. Clients 108, 110 and 112 are clients to server 104. Distributed data processing system 100 may include additional servers, clients, and other devices not shown.

In the depicted example, distributed data processing system 100 is the Internet, with network 102 representing a worldwide collection of networks and gateways that use the TCP/IP suite of protocols to communicate with one another. At the heart of the Internet is a backbone of high-speed data communication lines between major nodes or host computers consisting of thousands of commercial, government, education, and other computer systems that route data and messages. Of course, distributed data processing system 100 also may be implemented as a number of different types of networks such as, for example, an intranet or a local area network. FIG. 1 is intended as an example and not as an architectural limitation for the processes of the present invention.

Figure 2:
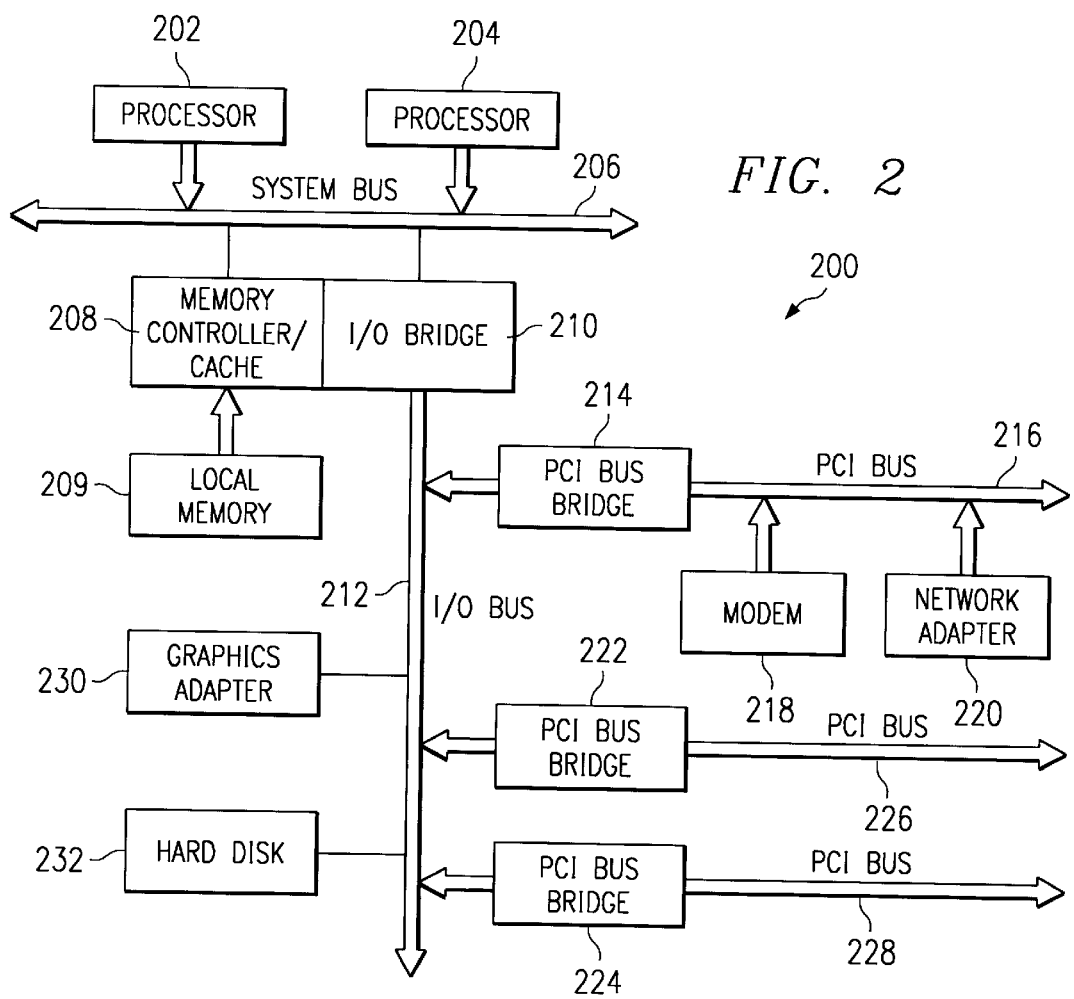
FIG. 2 is an exemplary block diagram of a server according to the present invention.

Referring to FIG. 2, a block diagram of a data processing system which may be implemented as a server, such as server 104 in FIG. 1, is depicted in accordance with the present invention. Data processing system 200 may be a symmetric multiprocessor (SMP) system including a plurality of processors 202 and 204 connected to system bus 206. Alternatively, a single processor system may be employed. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted. Peripheral component interconnect (PCI) bus bridge 214 connected to I/O bus 212 provides an interface to PCI local bus 216. A number of modems 218–220 may be connected to PCI bus 216. Typical PCI bus implementations will support four PCI expansion slots or add-in connectors. Communications links to network computers 108–112 in FIG. 1 may be provided through modem 218 and network adapter 220 connected to PCI local bus 216 through add-in boards. Additional PCI bus bridges 222 and 224 provide interfaces for additional PCI buses 226 and 228, from which additional modems or network adapters may be supported. In this manner, server 200 allows connections to multiple network computers. A memory mapped graphics adapter 230 and hard disk 232 may also be connected to I/O bus 212 as depicted, either directly or indirectly.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention. The data processing system depicted in FIG. 2 may be, for example, an IBM RISC/System 6000, a product of International Business Machines Corporation in Armonk, N.Y., running the Advanced Interactive Executive (AIX) operating system.

Figure 3:
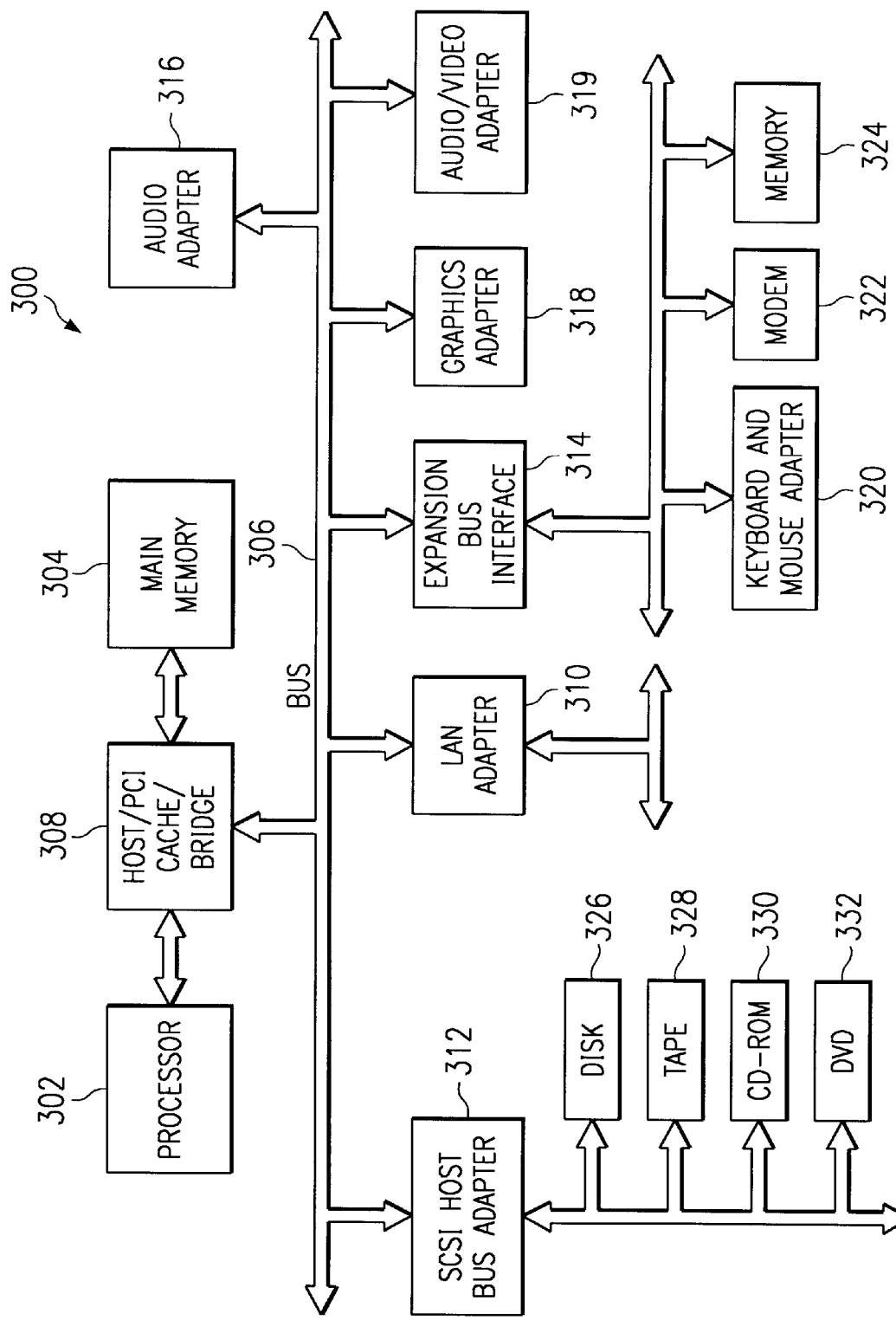
FIG. 3 is an exemplary block diagram of a client according to the present invention.

With reference now to FIG. 3, a block diagram of a data processing system in which the present invention may be implemented is illustrated. Data processing system 300 is an example of a client computer. Data processing system 300 employs a peripheral component interconnect (PCI) local bus architecture. Although the depicted example employs a PCI bus, other bus architectures, such as Micro Channel and ISA, may be used.

Processor 302 and main memory 304 are connected to PCI local bus 306 through PCI bridge 308. PCI bridge 308 may also include an integrated memory controller and cache memory for processor 302. Additional connections to PCI local bus 306 may be made through direct component interconnection or through add-in boards. In the depicted example, local area network (LAN) adapter 310, SCSI host bus adapter 312, and expansion bus interface 314 are connected to PCI local bus 306 by direct component connection.

In contrast, audio adapter 316, graphics adapter 318, and audio/video adapter (A/V) 319 are connected to PCI local bus 306 by add-in boards inserted into expansion slots. Expansion bus interface 314 provides a connection for a keyboard and mouse adapter 320, modem 322, and additional memory 324.

In the depicted example, SCSI host bus adapter 312 provides a connection for hard disk drive 326, tape drive 328, CD-ROM drive 330, and digital video disc read only memory drive (DVD-ROM) 332. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system, such as OS/2, which is available from International Business Machines Corporation. "OS/2" is a trademark of International Business Machines Corporation.

An object oriented programming system, such as Java, may run in conjunction with the operating system, providing calls to the operating system from Java programs or applications executing on data processing system 300. Instructions for the operating system, the object-oriented operating system, and applications or programs are located on a storage device, such as hard disk drive 326, and may be loaded into main memory 304 for execution by processor 302.

Those of ordinary skill in the art will appreciate that the hardware in FIG. 3 may vary depending on the implementation. For example, other peripheral devices, such as optical disk drives and the like, may be used in addition to or in place of the hardware depicted in FIG. 3. The depicted example is not meant to imply architectural limitations with respect to the present invention. For example, the processes of the present invention may be applied to multiprocessor data processing systems.

The present invention provides a mechanism by which pseudo-random data may be compressed. The mechanism may be implemented on a server device, client device, stand-alone computer, and the like. The present invention will be described in terms of functional devices which may be implemented in hardware and/or software, using the server device and/or client device in FIGS. 1–3, for example. The functional devices may incorporate one or more elements of the client/server devices shown in FIGS. 1–3.

In order to provide the mechanism set forth above, a server, client device, or stand-alone computing device, is used to implement the compression apparatus of the present invention. FIG. 4 is an exemplary block diagram illustrating the primary elements of a compression apparatus in accordance with the present invention. As shown in FIG. 4, the compression apparatus 400 includes an input/output interface 410, a compression device 420, a data analyzer 430, a stochastic model storage device 440, and a storage device 450. These elements are shown being coupled via a signal/data bus 460, however any other mechanism for coupling these elements may be utilized without departing from the spirit and scope of the present invention. As mentioned above, the elements 410–450 may be implemented as hardware, software, or a combination of hardware and software without departing from the spirit and scope of the present invention.

When data is to be compressed, the data is received by the compression apparatus 400 via the input/output interface 410. The compression device 420 attempts to perform compression on the data and determines if the compression was successful. This may be determined based on the size of the data after compression as compared to the size of the data before compression. If the sizes are virtually the same, within a predetermined tolerance, then the compression has not been successful.

As described above, standard compression techniques make use of repeated data sequences to perform compression. Rather than having multiple instances of this repeated data, identifiers of the data sequences or multiples of the data sequences are identified and utilized. Such compression techniques are not applicable to data that is "random" or pseudo random since there are little or no repeated data sequences that may be used to perform this compression.

Thus, with such "random" or pseudo random data, when the present invention attempts to compress the data, the result will be that there is little or no compression of the data. As a result, further processing of the data is necessary before the data can be compressed.

The data analyzer 430 is used to analyze the input data to determine a stochastic distribution of the data. The data analyzer 430 essentially performs a "curve-fitting" technique to approximate the distribution of the data to determine mathematical values such as, for example, the mean value and the standard deviation of the input data, that are representative of the distribution. The mathematical values are "seed" values for the random number generators used to generate an approximation of the input data.

A pseudo random stream with a similar stochastic distribution as the input stream can be generated using random number generators, such as LRAND, Polar algorithm, etc., that use the mathematical values as seed values, e.g., mean and a standard deviation, to generate pseudo-random data. The pseudo-random set of data points are then compared to the input data to determine a difference between the pseudo-random set of data points and the input data.

The particular stochastic model (random number generator, mean and the standard deviation) used to perform the compression of the present invention may be chosen in a number of different ways. In a preferred embodiment, the stochastic model whose differences between its data points and the input data remain fairly constant, is chosen as the stochastic model for use during compression. Alternatively, the same stochastic model may be used for every instantiation of the present invention regardless of how closely the stochastic model approximates the input data. Moreover, the stochastic model that results in an average difference that is the smallest, is then chosen as the stochastic model that best approximates the actual input data.

A difference data sequence is then stored for the input data. The difference data sequence is comprised of data representative of the difference between data points in the input data and data points in the stochastic model approximation. The difference data sequence will tend to be less "random" than either the input data or the stochastic data approximation. Thus, standard compression techniques may be used on the difference data sequence to thereby compress it.

With the present invention, the difference data sequence is compressed using standard compression techniques and provided, along with an indicator of the stochastic model used and the seed value used, as a compressed data file. This information is all that is necessary to recreate the original input data.

Thus, if this compressed file is to be decompressed to generate the original input data, the identified stochastic model is used with the identified seed value to generate a sequence of data points identical to the data points used to generate the difference data sequence. The compressed difference data sequence is then decompressed, in a manner generally known in the art, and added to the sequence of data points generated based on the identified stochastic model and seed value. The result is the original input data that was the subject of the compression of the present invention.

The above-described process may be repeated any number of times until the amount of compression obtained is less than a predetermined amount, i.e. until further iterations will not provide any further compression of the data. Thus, the compressed data file may include one or more identifications of stochastic model and seed value. From this information, the decompressing device may identify which stochastic model and seed value to use first, second, third, and so on, with each subsequent stochastic model operating on the results of the previous decompression step.

Thus, the present invention uses the following four basic passes on the input data to perform compression of the "pseudo-random" data:
(1) determine if standard compression is applicable;
(2) analyze the input data to identify a stochastic distribution model that approximates the input data;
(3) calculate a difference data sequence based on the stochastic model and the input data; and
(4) compress the difference data sequence and add stochastic distribution model identifier and seed value identifier.

In order to decompress a compressed difference data sequence file in accordance with the present invention, the following three steps are performed:
(1) decompress the difference data sequence;
(2) generate a stochastic distribution model data sequence based on the identified stochastic model and the seed value; and
(3) add the difference data sequence to the stochastic distribution model data sequence.

The compression/decompression technique of the present invention is applicable to any type of "pseudo-random" data. This may include, for example, binary representations of data structures, binary decision diagrams, binary executables, simulation data, and already compressed data files. Thus, for example, data files that have already been compressed using standard compression techniques, may be further compressed using the techniques of the present invention. In this way, data may be compressed to extremely small sizes allowing more data to be stored in a smaller storage space, less time for transmission over data communication links, and so on.

While the above exemplary embodiment of the present invention makes use of stochastic models to generate a pseudo random stream to approximate the input stream, the present invention is not limited to such. Rather, any pseudo random generation may be used. Furthermore, more than just the seed value may be included in the compressed data file of the present invention. Any parameters necessary to recreate the data sequence obtained using the curve-fitting model may be included with the compressed data file. Thus, more than just the seed value may be provided in the compressed data file dependent on the particular parameters required by the curve-fitting model. As an example of how the present invention may be used, assume that a LCG pseudo-random generator is to be used to generate a difference data sequence on input data. A pseudo-random sequence based on LCG can be characterized completely by the following parameters:
(1) a multiplier "A";
(2) an additive constant "C";
(3) a modulus "M"; and
(4) an initial seed value "S".

Therefore, if LCG is to be used for compressing input data, the approximation to be made is for the above four parameters. The seed value is used to ensure that the pseudo-random data sequence can be regenerated in the same sequence during decompression as it was done during compression. The modulus determines the range of the random numbers in the input data. Therefore, the approximation needs to be done for the multiplier and the constant. One approximation can be to just use the arithmetic mean for these two numbers as observed over the entire input data.

Assume then, that the input data is a series of numbers: 1, 5, 9, 2, 3, 6, 0, 8, 4, 7. The modulus for this stream will be 10. Any initial seed value, e.g., 1, may then be chosen so long as it's the same value during both compression and decompression. The approximation of the additive constant as an arithmetic mean will be 5 and the multiplier can be 2. This will result in a pseudo-random data sequence 7, 9, 3, 1, 7, 9, 3, 1, 7, 9 which will in turn result in a difference data sequence 6, 4, 6, 1, 4, 3, 3, 7, 3, 2. This difference data sequence has one repetition of 6, one of 4 and two of 3. For large pseudo-random input data, even such a simple difference data sequence can result in compression of up to or exceeding 30%.

FIG. 5 is a flowchart outlining an exemplary operation of the present invention when compressing a pseudo-random data file. As shown in FIG. 5, the operation starts with receiving the input data (step 510). Standard compression techniques are then applied to the input data (step 520) and a determination is made as to whether the standard compression techniques result in compression of the input data (step 530). If so, the operation returns to step 510. Otherwise, the operation continues to step 540.

The input data is analyzed to determine a stochastic distribution (step 540). Based on the stochastic distribution, a sequence of data point approximations is generated (step 550) using a stochastic distribution model and a difference data sequence between the sequence of data point approximations and the input data is calculated (step 560). The difference data sequence is then compressed and saved as a compressed data file along with an identifier of the stochastic distribution model used and any parameters used with the stochastic distribution model (step 570). The operation then ends. As discussed above, this process may be repeated until no further compression is obtained.

FIG. 6 is a flowchart outlining an exemplary operation of the present invention when decompressing a data file compressed in the manner described above. As shown in FIG. 6, the operation starts with receiving a compressed data file (step 610). The compressed difference data sequence is decompressed using the appropriate compression algorithm (step 620). The identified stochastic distribution model is then used, along with the identified parameters, to generate a pseudo-random set of data points that approximate the input data (step 630). The pseudo-random set of data points and the decompressed difference data sequence are added to generate the input data sequence (step 640) and the operation ends.

Thus, the present invention provides a mechanism by which data files that are not further compressible using standard compression techniques, may be compressed using the present invention. The present invention makes it possible to obtain highly compressed data files allowing smaller storage space and transmission times in order to store and distribute these data files.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, CD-ROMs, and transmission-type media such as digital and analog communications links.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of compressing data, comprising:
generating a distribution approximation of a distribution of the data;
calculating a difference between the distribution approximation and the distribution of the data;
compressing the difference between the distribution approximation and the distribution of the data; and
packaging the compressed difference with an indicator of a mechanism used to generate the distribution approximation.

2. The method of claim 1, further comprising:
applying standard compression on the data;
determining if the standard compression results in compression of the data; and
performing the generating, calculating and compressing steps, if the standard compression does not result in compression of the data.

3. A method of compressing data, comprising;
generating a distribution approximation of a distribution of the data, wherein generating a distribution approximation includes determining one or more mathematical values representative of the distribution;
calculating a difference between the distribution approximation and the distribution of the data; and
compressing the difference between the distribution approximation and the distribution of the data.

4. The method of claim 3, wherein generating the distribution approximation further includes using a random number generator that uses the one or more mathematical values to generate pseudo-random data.

5. The method of claim 4, wherein the random number generator is one of an LRAND algorithm and a Polar algorithm.

6. The method of claim 3, wherein the one or more mathematical values include at least one of a mean value and a standard deviation of the data.

7. A method of compressing data, comprising;
generating a distribution approximation of a distribution of the data;
calculating a difference between the distribution approximation and the distribution of the data;
compressing the difference between the distribution approximation and the distribution of the data; and
packaging the compressed difference between the distribution approximation and the distribution of the data, an indicator of a model used to generate the distribution approximation, and a seed value into a computer file.

8. The method of claim 7, further comprising:
decompressing the compressed difference between the distribution approximation and the distribution of the data;
generating another distribution approximation which is the same as the distribution approximation; and
adding the difference to the another distribution approximation to obtain the data.

9. An apparatus for compressing data, comprising:
means for generating a distribution approximation of a distribution of the data;
means for calculating a difference between the distribution approximation and the distribution of the data;
means for compressing the difference between the distribution approximation and the distribution of the data; and
means for packaging the compressed difference with an indicator of a mechanism used to generate the distribution approximation.

10. The apparatus of claim 9, further comprising:
means for applying standard compression on the data; and
means for determining if the standard compression results in compression of the data, wherein the means for generating, means for calculating and means for compressing operate if the standard compression does not result in compression of the data.

11. The method of claim 9, further comprising:
means for decompressing the compressed difference between the distribution approximation and the distribution of the data;
means for generating another distribution approximation which is the same as the distribution approximation; and
means for adding the difference to the another distribution approximation to obtain the data.

12. An apparatus for compressing data, comprising:
means for generating a distribution approximation of a distribution of the data, wherein the means for generating a distribution approximation includes means for determining one or more mathematical values representative of the distribution;
means for calculating a difference between the distribution approximation and the distribution of the data; and
means for compressing the difference between the distribution approximation and the distribution of data.

13. The apparatus of claim 12, wherein the means for generating the distribution approximation further includes a random number generator that uses the one or more mathematical values to generate pseudo-random data.

14. The apparatus of claim 13, wherein the random number generator is one of an LRAND algorithm and a Polar algorithm.

15. The apparatus of claim 12, wherein the one or more mathematical values include at least one of a mean value and a standard deviation of the data.

16. An apparatus for compressing data, comprising:
means for generating a distribution approximation of a distribution of the data;
means for calculating a difference between the distribution approximation and the distribution of the data;
means for compressing the difference between the distribution approximation and the distribution of data; and
means for packaging the compressed difference between the distribution approximation and the distribution of the data, an indicator of a model used to generate the distribution approximation, and a seed value into a computer file.

17. A computer program product in a computer readable medium for compressing data, comprising:
first instructions for generating a distribution approximation of a distribution of the data;
second instructions for calculating a difference between the distribution approximation and the distribution of the data;
third instructions for compressing the difference between the distribution approximation and the distribution of the data, wherein the third instructions further include instructions for packaging the compressed difference with an indicator of a mechanism used to generate the distribution approximation.

18. The computer program product of claim 17, further comprising:
fourth instructions for applying standard compression on the data;
fifth instructions for determining if the standard compression results in compression of the data; and
sixth instructions for execution the first, second and third instructions if the standard compression does not result in compression of the data.

19. A computer program product in a computer readable medium for compressing data, comprising:
first instructions for generating a distribution approximation of a distribution of the data, wherein the first instructions for generating a distribution approximation includes instructions for determining one or more mathematical values representative of the distribution;
second instructions for calculating a difference between the distribution approximation and the distribution of the data; and
third instructions for compressing the difference between the distribution approximation and the distribution of data.

20. The computer program product of claim 19, wherein the first instructions for generating the distribution approximation further includes instructions for using a random number generator that uses the one or more mathematical values to generate pseudo-random data.

21. The computer program product of claim 20, wherein the random number generator is one of an LRAND algorithm and a Polar algorithm.

22. The computer program product of claim 19, wherein the one or more mathematical values include at least one of a mean value and a standard deviation of the data.

23. A computer program product in a computer readable medium for compressing data, comprising:
first instructions for generating a distribution approximation of a distribution of the data;
second instructions for calculating a difference between the distribution approximation and the distribution of the data;
third instructions for compressing the difference between the distribution approximation and the distribution of data; and
fourth instructions for packaging the compressed difference between the distribution approximation and the distribution of the data, an indicator of a model used to generate the distribution approximation, and a seed value into a computer file.

24. The computer program product of claim 23, further comprising:
fifth instructions for decompressing the compressed difference between the distribution approximation and the distribution of the data;
sixth instructions for generating another distribution approximation which is the same as the distribution approximation; and
seventh instructions for adding the difference to the another distribution approximation to obtain the data.

25. A method for decompressing compressed data, comprising:
decompressing a difference data sequence, wherein the difference data sequence is packaged with an indicator of an approximation function;
generating a set of approximation data based on an approximation function and one or more parameters; and
adding the difference data sequence to the approximation data to generate decompressed data.

26. A method for decompressing compressed data, comprising:
decompressing a difference data sequence;
generating a set of approximation data based on an approximation function and one or more parameters, wherein generating a set of approximation data includes using a stochastic model and a seed value to generate the set of approximation data; and adding the difference data sequence to the approximation data to generate decompressed data.

27. The method of claim 26, wherein the seed value is at least one of a mean and a standard deviation of the compressed data prior to compression of the compressed data.

28. An apparatus for decompressing compressed data, comprising:

means for decompressing a difference data sequence, wherein the difference data sequence is packaged with an indicator of an approximation function;

means for generating a set of approximation data based on an approximation function and one or more parameters; and means for adding the difference data sequence to the approximation data to generate decompressed data.

29. An apparatus for decompressing compressed data, comprising:

means for decompressing a difference data sequence;

means for generating a set of approximation data based on an approximation function and one or more parameters, wherein the means for generating a set of approximation data includes means for using a stochastic model and a seed value to generate the set of approximation data; and means for adding the difference data sequence to the approximation data to generate decompressed data.

30. The apparatus of claim 29, wherein the seed value is at least one of a mean and a standard deviation of the compressed data prior to compression of the compressed data.

* * * * *